(12) United States Patent
Briggs et al.

(10) Patent No.: US 9,754,883 B1
(45) Date of Patent: Sep. 5, 2017

(54) HYBRID METAL INTERCONNECTS WITH A BAMBOO GRAIN MICROSTRUCTURE

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, LaGrangeville, NY (US); Michael Rizzolo, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/061,388

(22) Filed: Mar. 4, 2016

(51) Int. Cl.
H01L 23/52 (2006.01)
H01L 23/528 (2006.01)
H01L 21/768 (2006.01)

(52) U.S. Cl.
CPC ...... H01L 23/5283 (2013.01); H01L 21/7685 (2013.01); H01L 21/76865 (2013.01); H01L 21/76883 (2013.01)

(58) Field of Classification Search
CPC .................................................. H01L 23/5283
See application file for complete search history.

(56) References Cited

U.S. PATENT DOCUMENTS

| | | | |
|---|---|---|---|
| 6,242,349 B1 | 6/2001 | Nogami et al. | |
| 7,452,812 B2 | 11/2008 | Beyer et al. | |
| 7,569,475 B2 | 8/2009 | Yang et al. | |
| 7,737,026 B2 | 6/2010 | Li et al. | |
| 8,053,361 B2 | 11/2011 | Li et al. | |
| 8,232,646 B2 | 7/2012 | Bonilla et al. | |
| 8,525,339 B2 | 9/2013 | Yang et al. | |
| 8,901,744 B2 | 12/2014 | Yang et al. | |
| 2003/0022480 A1 | 1/2003 | Tsai et al. | |
| 2003/0073304 A1 | 4/2003 | Mak et al. | |
| 2008/0206984 A1* | 8/2008 | Sparks | H01L 21/76898 438/637 |
| 2009/0020800 A1 | 1/2009 | Tempel et al. | |
| 2009/0092817 A1* | 4/2009 | Mullner | C22C 19/00 428/304.4 |
| 2009/0174075 A1* | 7/2009 | Yang | H01L 23/5226 257/751 |

(Continued)

OTHER PUBLICATIONS

Anonymous, "Method and System Developing a Hybrid Contact Via (CA) Plug without Seams/Voids using Electroplating," IP.com, Nov. 2014. (pp. 1-6).

(Continued)

*Primary Examiner* — Evren Seven
*Assistant Examiner* — S. M. S Imtiaz
(74) *Attorney, Agent, or Firm* — Tutunjian & Bitetto, P.C.; Vazken Alexnian

(57) ABSTRACT

A method of forming an interconnect with a bamboo grain microstructure. The method includes forming a conductive filler layer in a trench of an insulating layer to a predetermined depth such that an aspect ratio of a top portion of the trench is reduced to a threshold level, depositing a metal layer over the conductive filler layer in the top portion of the trench, the metal layer having a plurality of small grains, and annealing the metal layer to provide a bamboo grain microstructure having larger grains than grain boundaries of the plurality of small grains.

14 Claims, 9 Drawing Sheets

(56) References Cited

U.S. PATENT DOCUMENTS

| | | | |
|---|---|---|---|
| 2009/0206484 A1* | 8/2009 | Baker-O'Neal | H01L 21/76873 257/751 |
| 2011/0064965 A1* | 3/2011 | Mullner | B22F 3/1115 428/613 |
| 2011/0312180 A1* | 12/2011 | Wang | H01L 21/31055 438/692 |
| 2013/0062769 A1* | 3/2013 | Cabral, Jr. | H01L 23/53238 257/751 |
| 2015/0348772 A1 | 12/2015 | Kolics | |

OTHER PUBLICATIONS

Non-final Office Action for corresponding U.S. Appl. No. 15/245,951. Mailed Oct. 20, 2016. (10 Pages).

\* cited by examiner

HYBRID METAL INTERCONNECTS WITH A BAMBOO GRAIN MICROSTRUCTURE

BACKGROUND

Technical Field

The present invention relates to semiconductor devices and, more particularly, to forming hybrid metal interconnects with a bamboo grain microstructure for semiconductor devices.

Description of the Related Art

Existing semiconductor devices often employ interconnects and/or contacts formed from a single material in a single layer. However, as device dimensions continue to decrease due to evolving technology, high aspect ratios of narrow features in the device, such as patterned features including interconnects and/or contacts, tend to increase. In addition, small grain structure within the narrow features persists due to the increased aspect ratios, especially toward the bottom of such narrow features even after annealing processes. These small grain microstructures in interconnect lines may significantly reduce electromigration performance of the semiconductor device.

Reducing the initial depth of the narrow features to lower the aspect ratios may improve grain growth, but at the expense of increasing line resistance. For example, at linewidths significantly less than 100 nanometers, a larger aspect ratio may prevent a bamboo microstructure from forming in the lines. Assuming a fixed linewidth constraint, however, means that having a shorter line decreases the volume of copper and thus increases electrical resistance. In addition, barrier layers embedded in the interconnect lines may sacrifice resistivity of the device, and high temperature annealing processes may affect via chain yield.

SUMMARY

According to an aspect of the present principles, a method for forming an interconnect with a bamboo grain microstructure is provided. The method may include forming a conductive filler layer in a trench of an insulating layer to a predetermined depth such that an aspect ratio of a top portion of the trench is reduced to a threshold level, depositing a metal layer over the conductive filler layer in the top portion of the trench, the metal layer having a plurality of small grains, and annealing the metal layer to provide a bamboo grain microstructure having larger grains than grain boundaries of the plurality of small grains.

According to another aspect of the present principles, a method for forming an interconnect with a bamboo grain microstructure is provided. The method may include depositing at least one conformal layer in a trench of an insulating layer such that the at least one conformal layer protects the insulating layer, forming conductive filler layer in the trench to a predetermined depth such that an aspect ratio of a top portion of the trench is reduced to a threshold level, the threshold level being approximately 1:1 or less, depositing a metal layer over the conductive filler layer in the top portion of the trench, the metal layer having a plurality of small grains, and annealing the metal layer to provide a bamboo grain microstructure having larger grains than grain boundaries of the plurality small grains.

According to another aspect of the present principles, an interconnect having a bamboo grain microstructure is provided. The interconnect may include a conductive filler layer formed in a trench of an insulating layer to a predetermined depth such that an aspect ratio of a top portion of the trench is reduced to a threshold level, and a metal layer formed in the top portion of the trench, the metal layer having a bamboo grain microstructure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
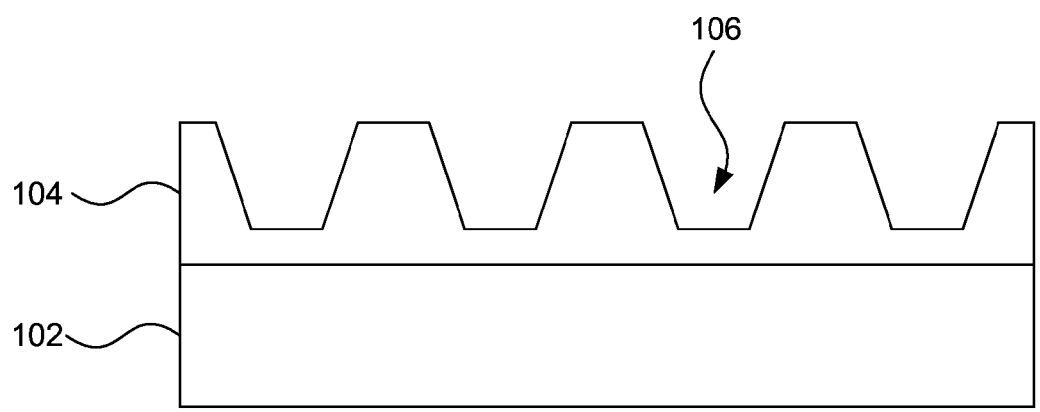
FIG. 1 is a cross-sectional view depicting forming an opening through an insulating layer to provide an interconnect structure, in accordance with one embodiment of the present disclosure.

The present principles are directed to methods and devices including hybrid metal interconnects with a bamboo grain microstructure. To decrease aspect ratios of patterned features, including trenches forming interconnects and/or contacts, and to improve grain structure within the patterned features, a conductive filler layer (e.g., a reflowable material) is formed within a trench such that the conductive filler layer decreases the aspect ratio of the trench prior to forming the metal interconnect layer. In some embodiments, the conductive filler layer may include a conductive material such that line resistance of the lines decreases compared to an interconnect formed of a single material, such as copper (Cu), of comparable low aspect ratio. In further embodiments, forming the conductive filler layer may allow the top interconnect layer to form a bamboo grain microstructure and/or a structure in which the boundaries of the grains tends to be aligned normal to the long axis and/or extend completely through the thickness of one or more layers. The present principles provided herein may result in hybrid interconnects exhibiting improved electromigration performance while preventing line resistances from increasing to unacceptably high values, as determined by the aspect ratio requirements.

The formation of the hybrid metal interconnect may be accomplished by depositing a conductive filler layer including a reflowable material over a trench and, using subsequent thermal processing (e.g., reflow), driving the conductive filler layer towards the bottom surface of the trench such that a bottom portion of the trench is filled with the material of the conductive filler layer (e.g., a prefill layer). A metal layer, such as copper (Cu), may be formed over the conductive filler layer to form the hybrid metal interconnect. In some embodiments, the conductive filler layer may include a metal different than the interconnect metal layer, such as a non-copper material.

Alternatively, the conductive filler layer may be deposited in the trench such that the conductive filler layer fills the entire trench. In some embodiments, the conductive filler layer may be formed to a height above the trench. A subsequent removal process may remove portions of the conductive filler layer to a predetermined depth to expose portions of the trench and an interconnect metal layer may be applied within the exposed portions to form the hybrid metal interconnect. Although copper is specifically contemplated and discussed herein, it should be understood that the present principles may be applied to other materials to create a hybrid metal interconnect for semiconductor devices.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It should be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

Referring now to the drawings in which like numerals represent the same or similar elements and initially to FIG. 1, a cross-sectional view of a semiconductor device with hybrid metal interconnects with a bamboo grain microstructure is illustratively depicted. A substrate 102 may be used and may include a bulk semiconductor substrate or may, alternatively, be a semiconductor-on-insulator substrate. In one example, the bulk-semiconductor substrate may be a silicon-containing material. Illustrative examples of silicon-containing materials suitable for a bulk-semiconductor substrate include, but are not limited to, silicon, silicon germanium, silicon germanium carbide, silicon carbide, polysilicon, epitaxial silicon, amorphous silicon, and multilayers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide.

An insulating layer 104 may be formed on the substrate 102. The insulating layer 104 may be formed by any appropriate process including, but not limited to, deposition processes, such as chemical vapor deposition, plasma enhanced chemical vapor deposition, chemical solution deposition, physical vapor deposition, and spin on deposition. The insulating layer 104 may include various materials including an oxide, such as silicon oxide, nitride, such as silicon nitride, and/or other dielectric materials. In the case of a semiconductor-on-insulator substrate, the insulating layer 104 may include a dielectric material that may, for example, be formed from silicon dioxide.

At least one trench 106 may be formed in the insulating layer 104 by any appropriate process. For example, in some embodiments, a pattern is produced on the insulating layer 104 by applying a photoresist to the surface to be etched; exposing the photoresist to a pattern of radiation; and then developing the pattern into the photoresist utilizing resist developer. Once the patterning of the photoresist is completed, the sections of the insulating layer 104 that are covered by the photoresist are protected while the exposed regions are removed using a selective etching process that removes the unprotected regions. The etch process may be an anisotropic etch, such as reactive ion etch. After forming the trench 106, the photoresist mask may be removed using chemical stripping, selective etching or oxygen ashing. For example, the insulating layer 104 may be patterned and/or etched to form at least one opening/trench 106. The trench 106 may include various depths and/or widths, however it is readily contemplated that the trench includes a depth of approximately 52 nanometers (nm) and a width of approximately 26 nm.

Figure 2:
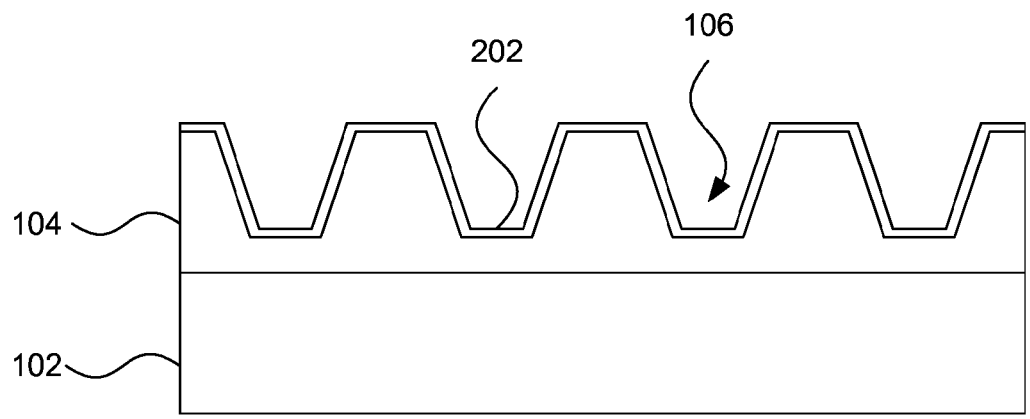
FIG. 2 is a cross-sectional view depicting one embodiment of forming a barrier layer on the horizontal and vertical surfaces of the opening depicted in FIG. 1.

Referring now to FIG. 2, a barrier layer 202 may be deposited over the insulating layer 104 and/or the trench 106 such that a uniform barrier layer 202 is formed. The barrier layer 202 may include various materials, such as tantalum (Ta), tantalum nitride (TaN), Ti-based nitrides, self-forming barrier materials, such as manganese (e.g., to form Mn-silicate), and/or any refractory metal. In some embodiments, the barrier layer 202 may provide adhesion between the insulating layer 104 and any subsequent layers and/or provide protection to the insulating layer 104 and/or subsequent layers. For example, the barrier layer 202 may include any metal that is highly corrosion-resistant such that the insulating layer 104 and any additional layers inside trench 106 remain physically/chemically isolated (e.g., no diffusion of metal from inside trench 106 into layer 104, and no diffusion of oxygen from layer 104 into trench 106). Thicknesses of the barrier layer 202 may include any range between 1-10 nm.

The barrier layer 202 may be formed by any known processes, including deposition processes. The barrier layer 202 may be deposited using a conformal deposition process. The term "conformal" denotes a layer having a thickness that does not deviate from greater than or less than 30% of an average value for the thickness of the layer. It is particularly contemplated that chemical vapor deposition (CVD) may be employed to deposit the barrier layer 202, however any appropriate deposition process, such as physical vapor deposition (PVD), atomic layer deposition (ALD), or gas cluster ion beam (GCIB) deposition may be used. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (EPCVD), and Metal-Organic CVD (MOCVD) and combinations thereof may also be employed.

In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
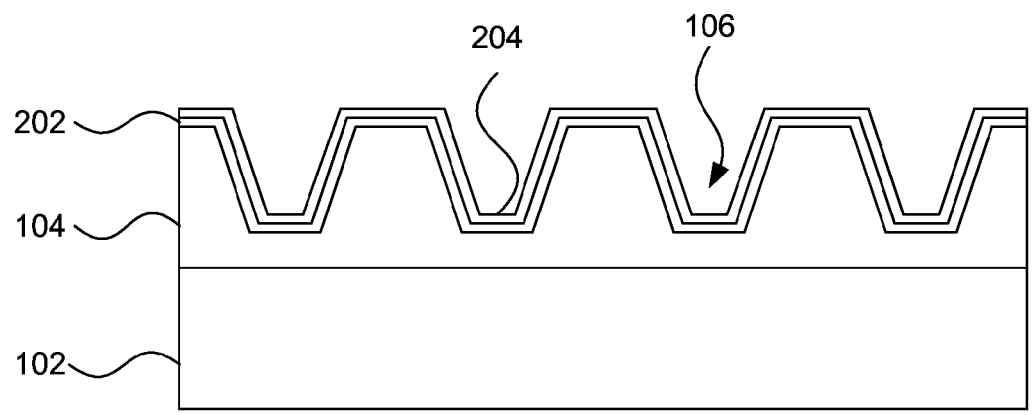
FIG. 3 is a cross-sectional view depicting forming a liner on horizontal surfaces and vertical surfaces of the opening, in accordance with one embodiment of the present disclosure.

Referring now to FIG. 3, one embodiment includes forming a uniform liner 204 over the barrier layer 202 (if formed) and/or insulating layer 104. When formed, the liner 204 may provide a uniform layer within the trench 106. The liner 204 may include various materials, such as cobalt (Co), ruthenium (Ru), tantalum (Ta), or combinations thereof. In some embodiments, the liner 204 may provide corrosion-prevention to adjacent layers and/or may increase corrosion resistance of adjacent layers. In further embodiments, the liner 204 may include any material having reflow-assist capabilities to aid in reflow of refractory metals with high melting points. For example, the liner 204 may assist in the reflow of the first metal material 206, as described in further detail below.

In some embodiments, the liner 204 may obstruct copper (Cu) atoms from migrating into the insulating layer 104. In some embodiments, the liner 204 provides good adhesion for the subsequently deposited metal fill, such as copper metal fill. In another embodiment, the liner 204 may also function as an oxygen getter, seed layer and/or adhesion promoter. The liner 204 may be deposited using a conformal deposition process. The term "conformal" denotes a layer having a thickness that does not deviate from greater than or less than 30% of an average value for the thickness of the layer. In some embodiments, the liner 204 may be deposited using chemical vapor deposition, such as plasma enhanced chemical vapor deposition (PECVD). In other embodiments, the liner 204 may be deposited using atomic layer deposition (ALD). The liner 204 may have a thickness ranging from 1 nm to 10 nm. In some embodiments, the liner 204 may be omitted. Exemplary liner materials may include pure or alloy forms of cobalt (Co), tantalum (Ta), manganese (Mn), and ruthenium (Ru), and may provide good adhesion with the conductor metal.

Figure 4:
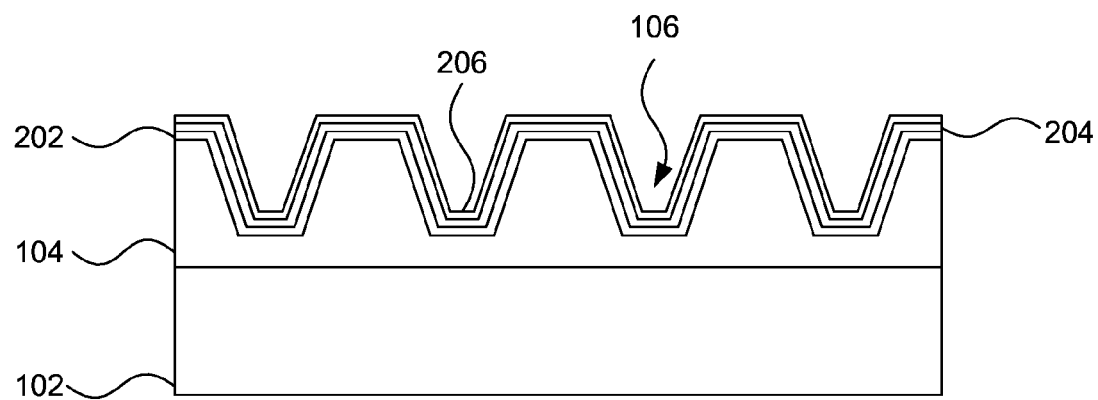
FIG. 4 is a cross-sectional view depicting one embodiment of forming a conductive filler layer in the opening, in accordance with one embodiment of the present disclosure.

Referring now to FIG. 4, a conductive filler layer 206 may be uniformly/conformally deposited over the barrier layer 202 and/or liner 204. The conductive filler layer 206 may be deposited using CVD, PVD, ALD, and/or any other known deposition processes. In an embodiment, the conductive filler layer 206 and the liner 204 may include the same material. In some embodiments, the conductive filler layer 206 may include non-refractory metals having a relatively low melting point, such as cobalt (Co), nickel (Ni), aluminum (Al), manganese (Mn), gold (Au), silver (Ag), or combination thereof, etc. In other embodiments, the conductive filler layer 206 may include refractory metals with high melting points, such as tungsten (W), titanium (Ti), tantalum (Ta), or combination thereof. When refractory metals having high melting points are employed for the conductive filler layer 206, it may be advantageous to employ a liner 204 having reflow-assist capabilities to aid in the reflow of the conductive filler layer 206.

In further embodiments, the conductive filler layer 206 may include any additional metals that are capable of being reflowed. In some embodiments, the conductive filler layer 206 may include any non-copper metals, including cobalt (Co), nickel (Ni), aluminum (Al), manganese (Mn), gold (Au), and/or silver (Ag). In some embodiments, the conductive filler layer 206 may include a material different than the metal layer 210. For example, the conductive filler layer 206 may include any non-copper material when the metal layer 210 includes copper, since having different metals allows more current to flow through the bamboo microstructure copper of the metal layer 210. If the materials used were the same, the bottom portion of the trench would form grains prior to the second deposition of copper, and the interface of the top and bottom grains is a fast-diffusion pathway for electromigration.

Figure 5:
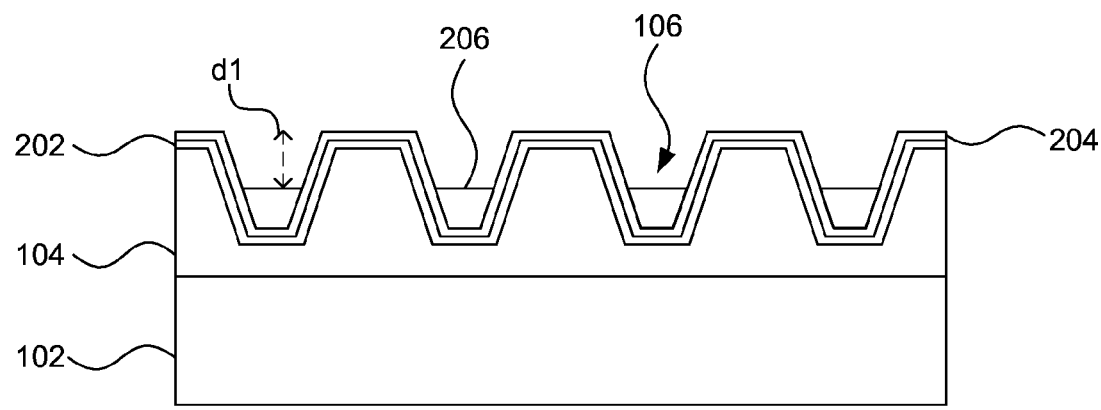
FIG. 5 is a cross-sectional view depicting one embodiment of reflowing the conductive filler layer in the opening to fill a bottom portion of the trenches, in accordance with one embodiment of the present disclosure.

Referring now to FIG. 5, a reflow anneal may be performed when the conductive filler layer 206 includes a reflowable material. The reflow anneal may reflow the conductive filler layer 206 toward the bottom surface of the trench 106 to a predetermined depth d1. For example, the conductive filler layer 206 may be reflowed such that the conductive filler layer 206 fills a bottom portion of the trench 106 to a predetermined depth of approximately 26 nanometers. During the reflow process, the conductive filler layer 206 is reflowed into the bottom of the narrow features of the device. Accordingly, reflow of the conductive filler layer 206 into the narrow features of the trench 106 (e.g., bottom portion) reduces the aspect ratio of the top portion of the trench 106. For example, because the conductive filler layer 206 is reflowed towards the bottom portion of the trench 106, only a top portion of the trench 106 remains unfilled, thereby resulting in a reduced aspect ratio of the remainder of the trench 106 (e.g., top portion).

In some embodiments, the aspect ratio may be defined as line height/depth divided by line width of the trench 106. By reflowing and/or forming the conductive filler layer 206 in the bottom portion of the trench 106, the aspect ratio of the top portion of the trench 106 may be reduced to a threshold level. In an embodiment, the threshold level may be approximately in the range of 1:1 or less. Accordingly, the present principles may be applied to trenches of various sizes, since approximate depths of the trench 106 may be dependent on the width of the trench 106. It should be noted that while the conductive filler layer 206 reduces the aspect ratio of the top portion of the trench 106 to approximately 1:1 or less, the aspect ratio of the whole trench and/or bottom portion of the trench 106 is not limited since the aspect ratio of the conductive filler layer 206 is not restricted.

In some embodiments, the reflow process of the reflowable material of the conductive filler layer 206 may employ temperatures in a range approximately between 100-400 degrees Celsius (° C.) for approximately 30 minutes or less. The reflow may be performed using, for example, a furnace, rapid thermal anneal (RTA), or rastered radiant heat source (e.g., laser). Reflow processes may allow for partial and/or full bottom-up fill of narrow features due to capillary action. In an embodiment, an optional partial etch process and/or chemical mechanical planarization (CMP) (not shown) may be performed to remove any excess portions of the conductive filler layer 206, such as excess portions of the conductive filler layer 206 that remain outside of the trench 106 after the reflow anneal and/or deposition process.

Figure 6:
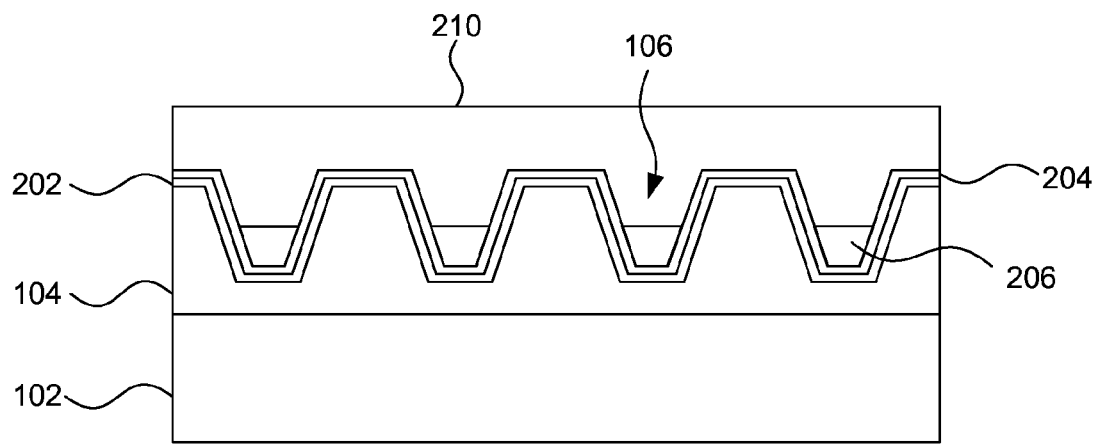
FIG. 6 is a cross-sectional view depicting forming a metal layer on horizontal surfaces and vertical surfaces of the opening, in accordance with one embodiment of the present disclosure.

Referring now to FIG. 6, a metal layer 210 may be formed over the conductive filler layer 206, liner 204, and/or barrier layer 202. The metal layer 210 may include, but is not limited to, copper (Cu), or copper alloy (e.g., CuMn). In some embodiments, the metal layer 210 may be formed by plating processes, reflow processes, deposition processes, etc. It should be understood that the metal layer 210 may include a plurality of fine-grain and/or small grain microstructures within the material, as will be described in further detail below. In some embodiments, these small grain microstructures may be inherent in the metal layer 210. In some embodiments, the plurality of small grain sizes may range approximately between 10-100 nm, and cause increased scattering (e.g., increasing electrical resistivity) while decreasing electromigration lifetime. The metal layer 210 may be deposited such that the remainder of the trench 106, such as the top portion of the trench 106, is filled (e.g., the remaining 26 nm of the trench 106).

Figure 7:
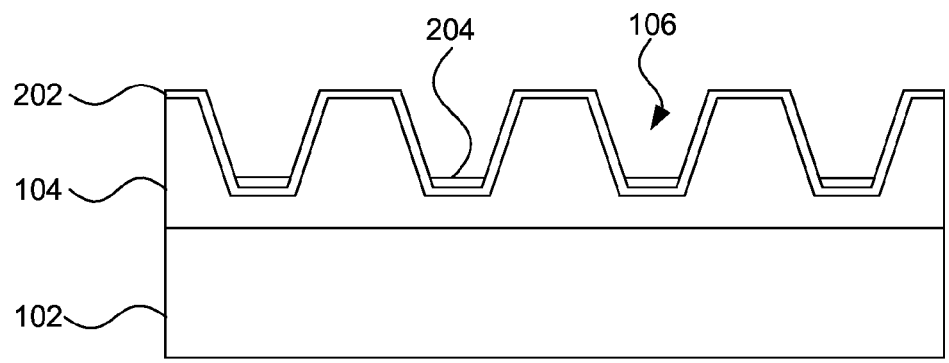
FIG. 7 is a cross-sectional view depicting an alternate embodiment of reflowing the liner in the opening of the trenches depicted in FIG. 3.

Now referring to FIG. 7, a cross-sectional view of reflowing the liner 204 is illustratively depicted in accordance with an alternate embodiment. As shown in FIG. 7, the liner 204 may include a reflowable material and may be reflowed toward the bottom of the trench 106 such that the liner 204 no longer remains on the sidewalls of the top portion of the trench 106 and/or exposed portions outside of the trench 106. As described above, the reflow process may include subjecting the liner 204 to various heat treatments, such as rapid thermal anneal (RTA) and/or rastered radiant heat source.

Figure 8:
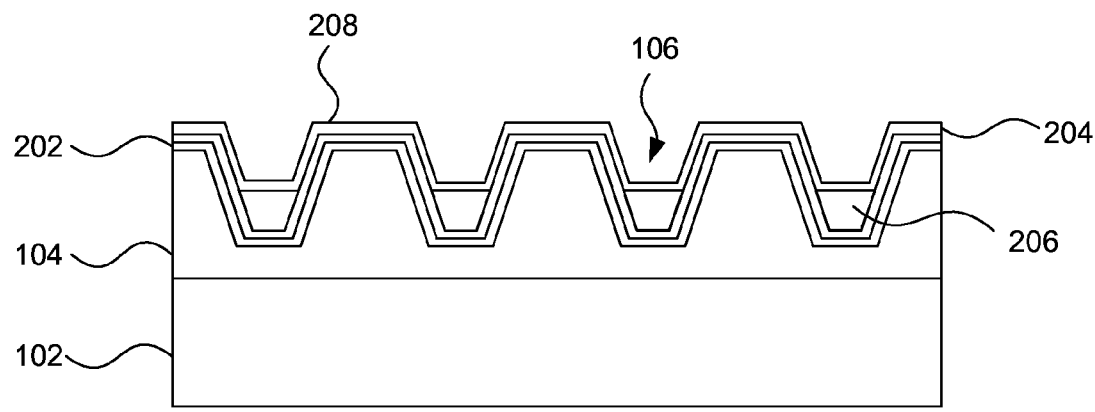
FIG. 8 is a cross-sectional view depicting an alternate embodiment of forming a seed layer on horizontal surfaces and vertical surfaces of the opening.

With reference to FIG. 8, a cross-sectional view of forming a seed layer 208 is illustratively depicted. As shown in FIG. 8, a seed layer 208 may be formed on exposed portions of the conductive filler layer 206. The seed layer 208 may include, but is not limited to, copper (Cu), copper-alloy, and/or any other material that may be employed as a seed layer for the metal layer 210. In an embodiment, the seed layer 208 may be formed by deposition processes. In some embodiments, the seed layer 208 may further provide a reduction in the aspect ratio of the top portion of the trench 106, which may enhance the process window of the interconnect and/or device. The process window is a range of parameters that allow a circuit to operate within certain optimal specifications and/or provide preferred manufacturing process yields. In further embodiments, the seed layer 208 may provide adhesion between the conductive filler layer 206 and the metal layer 210 and/or prevent corrosion between the conductive filler layer 206 and the metal layer 210.

Figure 9:
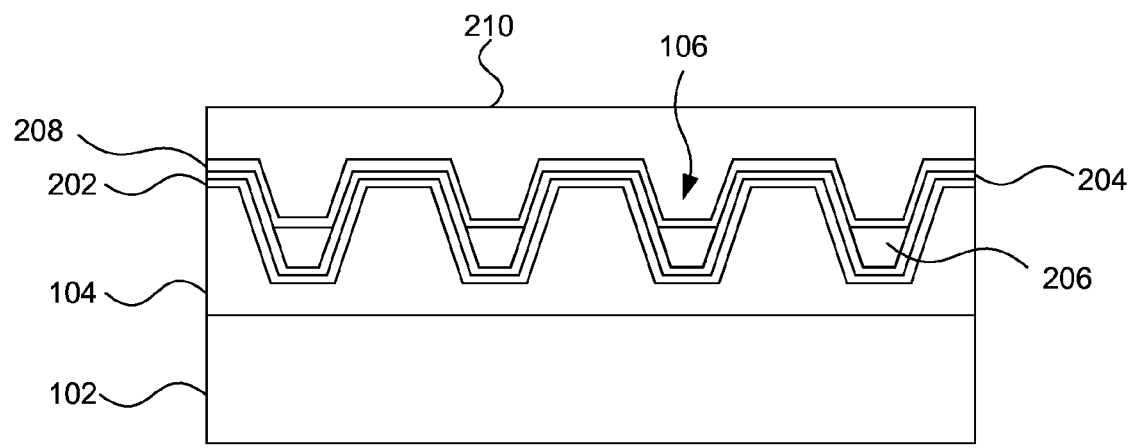
FIG. 9 is a cross-sectional view depicting forming a metal layer on horizontal surfaces and vertical surfaces of the opening over the seed layer depicted in FIG. 8, in accordance with one embodiment of the present disclosure.

Referring now to FIG. 9, the metal layer 210 may be formed over the seed layer 208. Because the aspect ratio of the top portion of the trench 106 has been reduced by, for example, the conductive filler layer 206 and the seed layer 208, only the remaining portion of the trench 106 (e.g., the top portion) is filled with the material of the metal layer 210. The metal layer 210 may include, but is not limited to, copper (Cu) or copper alloy (e.g., CuMn).

Figure 10:
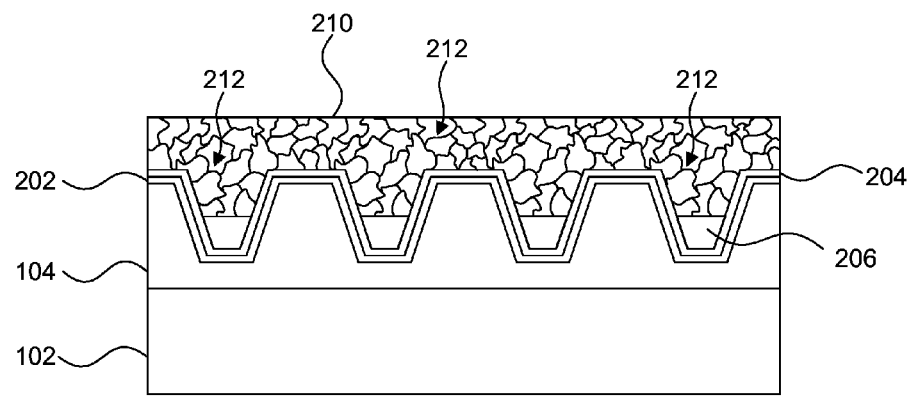
FIG. 10 is a cross-sectional view depicting a detailed illustration of small grain microstructure in the metal layer, in accordance with one embodiment of the present disclosure.

Now referring to FIG. 10, a more detailed illustration of the metal layer 210 is illustratively depicted. The metal layer 210 may include a microstructure of a plurality of fine/small grains. Specifically, as shown in FIG. 10, the metal layer 210 may include a plurality of grain boundaries 212, having grain sizes of approximately 10-100 nm. A grain boundary may be defined as the interface between two grains, or crystallites, in a material. Increased amounts of grain boundaries may decrease the electrical and/or thermal conductivity of the material. In addition, each grain boundary may provide a site for corrosion, as small grain boundaries are the preferred site for segregation of impurities. In some embodiments, the small grain boundaries may be inherent in the metal layer 210.

Figure 11:
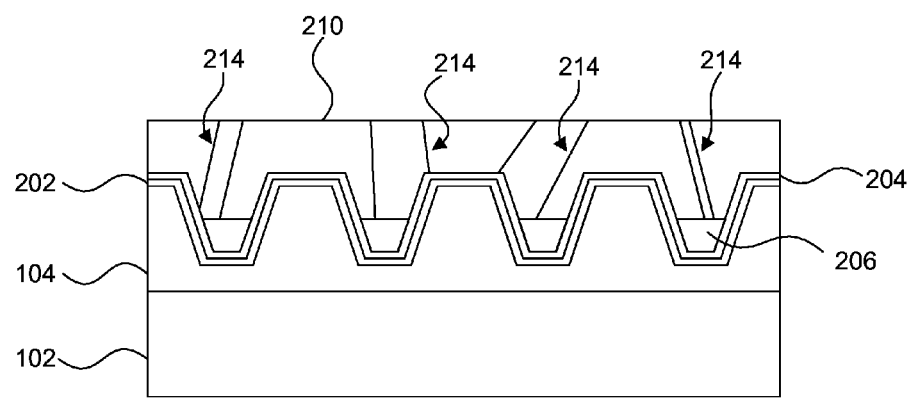
FIG. 11 is a cross-sectional view depicting one embodiment of annealing the metal layer to form a bamboo grain microstructure in the metal layer, in accordance with one embodiment of the present disclosure.

With reference to FIG. 11, the metal layer 210 may be annealed to form hybrid metal interconnects with a bamboo grain microstructure 214. In some embodiments, the bamboo grain microstructure 214 may exhibit grain sizes that are larger than the small grains. For example, the bamboo grain microstructure may include grain sizes of approximately 100 nm-10,000 nm, which is an increased grain size range because the grains in the lines are less constrained in growth. A bamboo grain microstructure 214 may include grain boundaries that are substantially aligned normal to the long axis of the interconnect and/or extend completely through the thickness of one or more layers. For example, bamboo grain microstructures may exhibit grain boundaries that are substantially perpendicular to the length of the interconnect. With such a structure, the resistance to electromigration increases and material transport may be reduced. In some embodiments, electrical resistivity of the metal layer 210 may be reduced as the flow of electrons is impeded by fewer grain boundaries.

As shown in FIG. 11, bamboo grain boundaries 214 may form in the metal layer 210 after and/or during the annealing process. In some embodiments, the bamboo grain boundaries 214 extend completely through the vertical axis of the metal layer 210 and/or within the trench 106. The reduced aspect ratio of the top portion of the trench 106 where the metal layer 210 is formed allows the small grain boundaries 212 in the metal layer 210 to largely recrystallize to bamboo grain boundaries 214, since the depth of the trench 106 where the metal layer 210 is formed directly influences the grain structure. The resulting hybrid interconnect having a bamboo grain microstructure may exhibit improved electromigration performance while preventing increased line resistances.

In some embodiments, the conductive filler layer 206 may have either small or large grain structures. For example, since the conductive filler layer 206 may include materials with a higher melting point, the activation energy for electromigration in the conductive filler layer 206 may be significantly higher than the metal layer 210. In addition, since the resistance of the conductive filler layer 206 may be higher, more current may flow through the bamboo microstructure of the metal layer 210. In some embodiments, the size/dimensions of the crystalline structure of the conductive filler layer 206 may increase when the conductive filler layer 206 is reflowed. In further embodiments, the annealing of the metal layer 210 may increase the size of the grains in the conductive filler layer 206.

Figure 12:
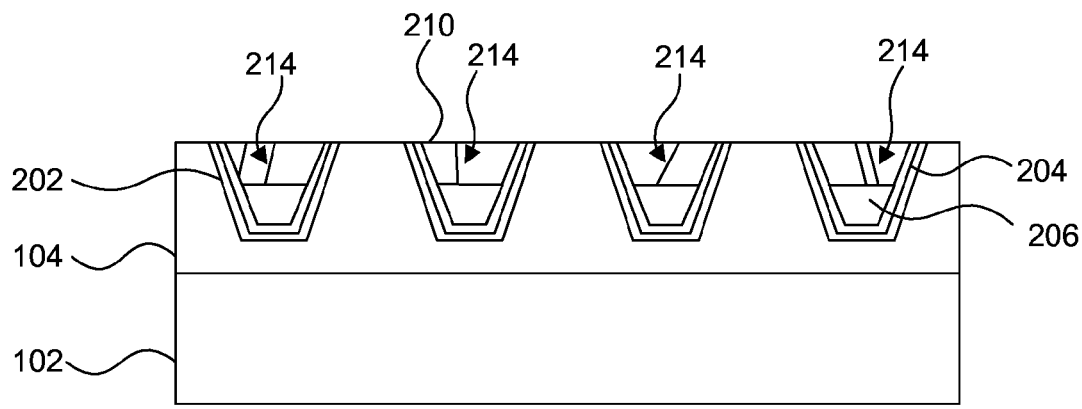
FIG. 12 is a cross-sectional view depicting one embodiment of removing excess portions of the metal layer depicted in FIG. 11.

Referring now to FIG. 12, a planarization process, such as chemical mechanical planarization (CMP), may be employed so that an upper surface of the metal layer 210 is coplanar with the upper surface of the insulating layer 104. In addition, CMP may be performed to remove any excess material of the metal layer 210. For example, the CMP may remove any excess of the metal layer 210 from the top of the device and may separate out the trenches 106. In some embodiments, the CMP may remove top portions of the barrier layer 202 and/or liner 204 such that the insulating layer 104 is re-exposed. In some embodiments, CMP is performed using, e.g., a chemical or granular slurry and mechanical force to gradually remove upper layers of the device. The slurry may be formulated to be unable to dissolve, for example, the material forming the insulating layer 104, resulting in the CMP process's inability to proceed any farther than that layer.

Figure 13:
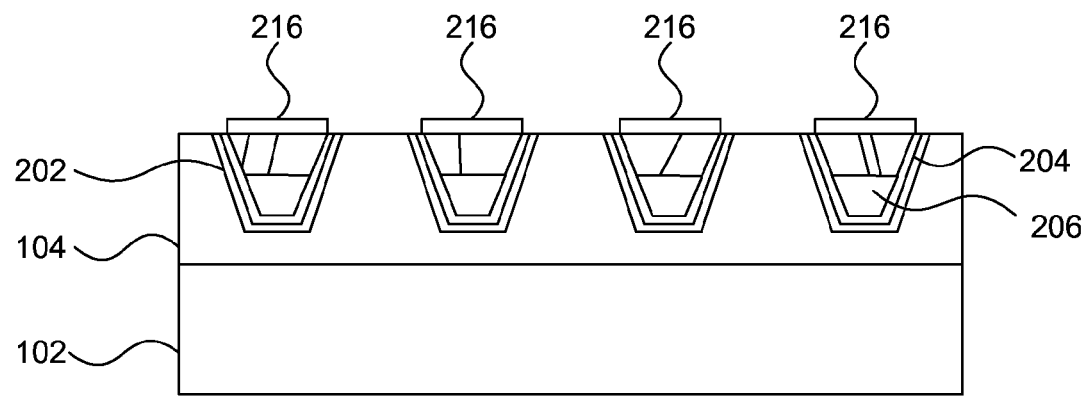
FIG. 13 is a cross-sectional view depicting forming a metal cap layer on horizontal surfaces of the exposed metal layer, in accordance with one embodiment of the present disclosure.

Now referring to FIG. 13, a metal cap layer 216 may be formed over the upper surface of the metal layer 210. The metal cap layer 216 may include a selectively deposited metal (e.g., selective CVD Co). In some embodiments, the metal cap layer 216 may extend over the metal layer 210 such that the insulating layer 104, barrier layer 202, and/or liner 204 remain exposed. The metal cap layer 216 may be formed by any deposition and/or plating processes. For example, the metal cap layer 216 may be deposited using chemical vapor deposition (CVD). Examples of CVD that are suitable for forming the metal cap layer 216 include, but are not limited to, Atmospheric Pressure CVD (APCVD), Low Pressure CVD (LPCVD) and Plasma Enhanced CVD (EPCVD), Metal-Organic CVD (MOCVD) and combinations thereof. The thickness of the metal cap layer 216 may range from 1 nm to 5 nm.

Figure 14:
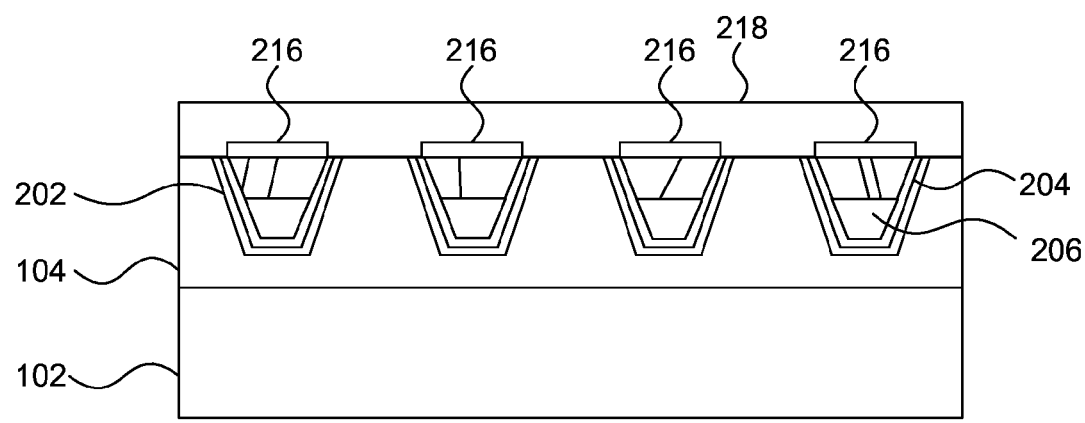
FIG. 14 is a cross-sectional view depicting forming an insulating cap layer over horizontal surfaces of the insulating layer and/or the metal cap layer, in accordance with one embodiment of the present disclosure.

In a further embodiment, an insulating cap layer 218 may be formed over the metal cap layer 216, as shown in FIG. 14. In some embodiments, the insulating cap layer 218 may be formed over exposed portions of the insulating layer 104, barrier layer 202, and/or liner 204. The insulating cap layer 218 may include, but is not limited to, an oxide, a nitride, such as silicon nitride, and/or other dielectric materials. For example, the insulating cap layer 218 may be composed of $SiO_2$, $Si_3N_4$, SiCOH, SiLK, and combinations thereof. In some examples, the insulating cap layer 218 a may be composed of a low-k dielectric. The term "low-k" denotes a material having a dielectric constant that is less than silicon dioxide at room temperature (e.g., 25° C.). In one embodiment, the insulating cap layer 218 of a low-k dielectric has a dielectric constant that is less than 4.0, e.g., 3.9. In another embodiment, the insulating cap layer 218 of a low-k dielectric may have a dielectric constant ranging from 1.75 to 3.5. In yet another embodiment, the insulating cap layer 218 of a low-k dielectric may have a dielectric constant ranging from 2.0 to 3.2. Examples of materials suitable for a low-k dielectric that can provide the insulating cap layer 218 include organosilicate glass (OSG), fluorine doped silicon dioxide, carbon doped silicon dioxide, porous silicon dioxide, low-K nitride barriers (e.g., NBLoK), SiN/SiNO multilayers, porous carbon doped silicon dioxide, spin-on organic polymeric dielectrics (e.g., SILK™), spin-on silicone based polymeric dielectric (e.g., hydrogen silsesquioxane (HSQ), undoped silica glass, diamond like carbon (DLC), methylsilsesquioxane (MSQ) and combinations thereof.

Figure 15:
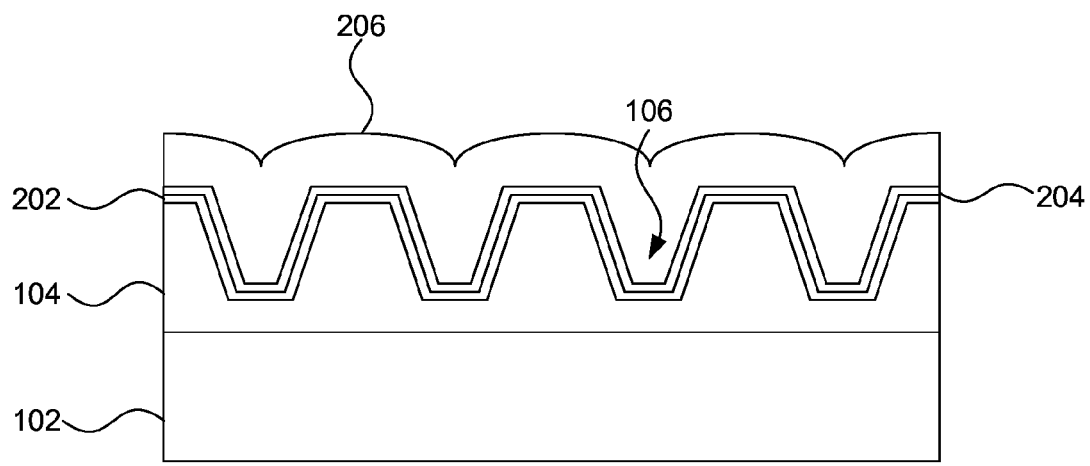
FIG. 15 is a cross-sectional view depicting one embodiment of forming a conductive filler layer in the opening depicted in FIG. 3, in accordance with one embodiment of the present disclosure.

Referring now to FIG. 15, a cross-sectional view of hybrid metal interconnects is shown following the structure provided in FIG. 3 above. Rather than uniformly depositing a conductive filler layer 206 over the barrier layer 202, the conductive filler layer 206 may be deposited such that the entire depth of the trench 106 is filled with the conductive filler layer 206 to a height above the trenches 106. The conductive filler layer 206 may be formed over barrier layer 202 and/or liner 204. In some embodiments, the liner 204 may be optional. The conductive filler layer 206 may be deposited using CVD, PVD, ALD, reflow or combination thereof, and/or any other known deposition processes. As described above, the conductive filler layer 206 may include reflowable materials, such as cobalt (Co), nickel (Ni), aluminum (Al), manganese (Mn), gold (Au), silver (Ag), or combination thereof. In some embodiments, the conductive filler layer 206 may include other materials, such as manganese (Mn), tungsten (W), titanium (Ti), tantalum (Ta), or combination thereof, in combination with a reflow assist layer (e.g., liner 204). In an embodiment, the conductive filler layer 206 and the liner 204 may include the same materials.

Figure 16:
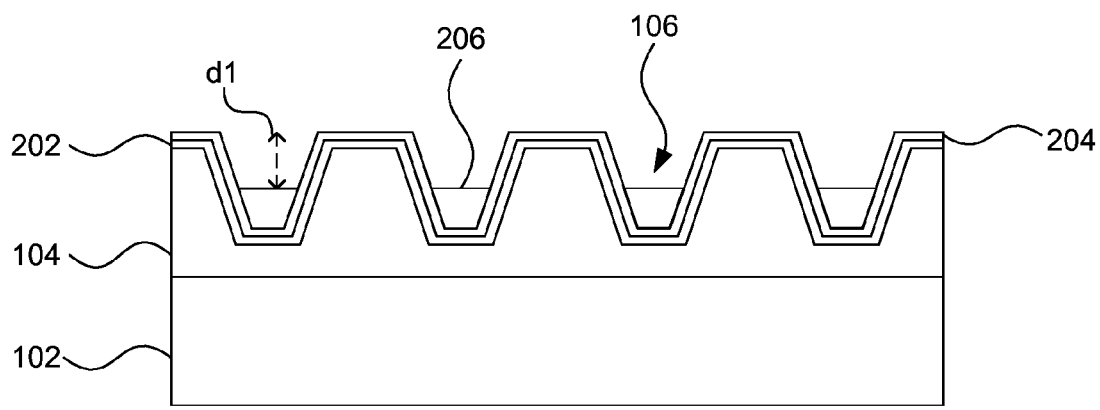
FIG. 16 is a cross-sectional view depicting removing a portion of the conductive filler layer depicted in FIG. 15, in accordance with one embodiment of the present disclosure.
Figure 17:
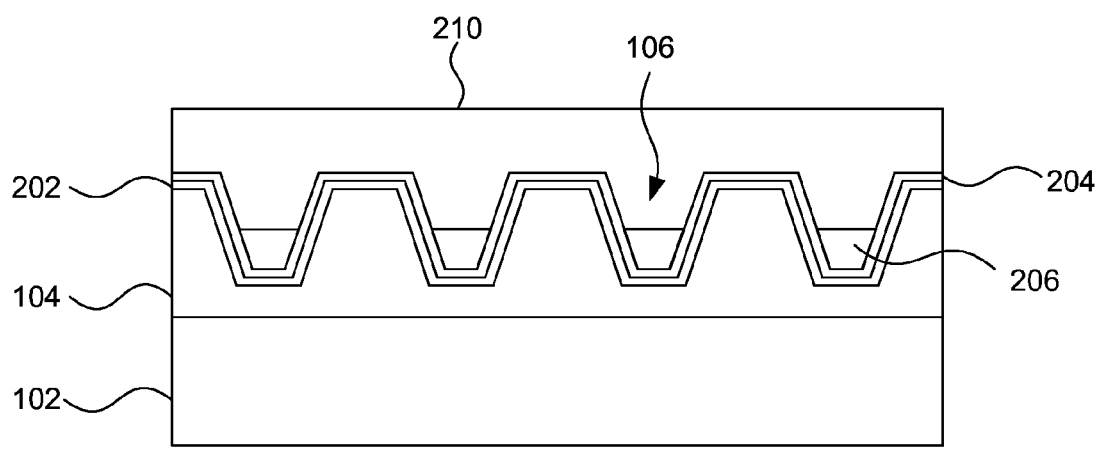
FIG. 17 is a cross-sectional view depicting forming a metal layer on horizontal surfaces and vertical surfaces of the opening, in accordance with one embodiment of the present disclosure.

Now referring to FIG. 16, the conductive filler layer 206 may be recessed to re-expose a predetermined portion of the trench 106. For example, some of the conductive filler layer 206 may be removed to a predetermined depth d1 such that the aspect ratio of the top portion of the trench 106 is reduced to a threshold level. It is readily contemplated that CMP, selective wet etch (e.g., WETS), or combination thereof may be performed to remove portions of the conductive filler layer 206 to the desired depth. In some embodiments, the liner 204 includes a material that is capable of withstanding such CMP processes (e.g., an etch stop layer). For example, CMP may remove portions of the conductive filler layer 206 without removing any of the liner 204. As shown in FIG. 17, a metal layer 210 may be formed in the remaining top portion of the re-exposed trench 106. It is readily contemplated that additional processing may be performed, including annealing the metal layer 210 to form bamboo grain structures, as described above with reference to FIG. 11.

Figure 18:
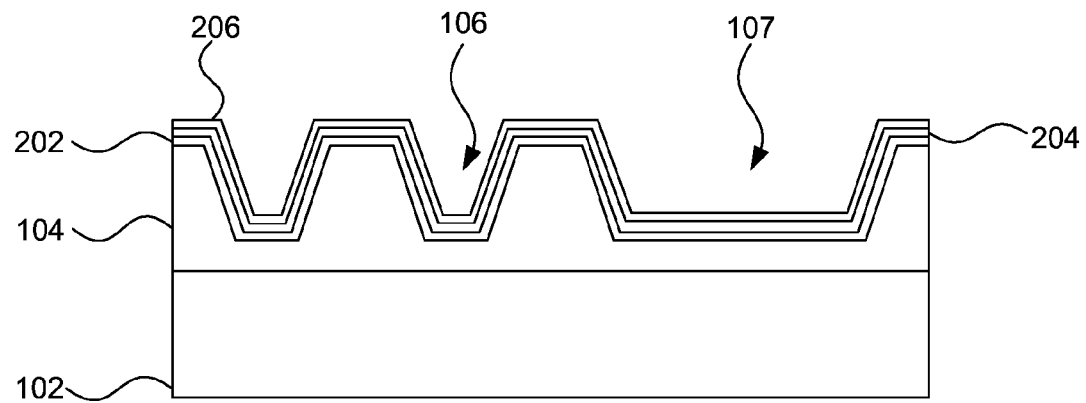
FIG. 18 is a cross-sectional view depicting forming a barrier layer, a liner, and a conductive filler layer in a narrow opening and a wide opening, in accordance with one embodiment of the present disclosure.

Now referring to FIG. 18, the insulating layer 104 may include a plurality of trenches of different sizes and/or widths, including a narrow trench 106 and a wide trench 107. In some embodiments, the narrow trench 106 and the wide trench 107 may have the same depth measurement but vary in the width measurement of the opening. The narrow trench 106 and the wide trench 107 may include a barrier layer 202, a liner 204, and a conductive filler layer 206, as described above. In some embodiments, the conductive filler layer 206 may be reflowed and/or etched down in accordance with the embodiments described above.

Figure 19:
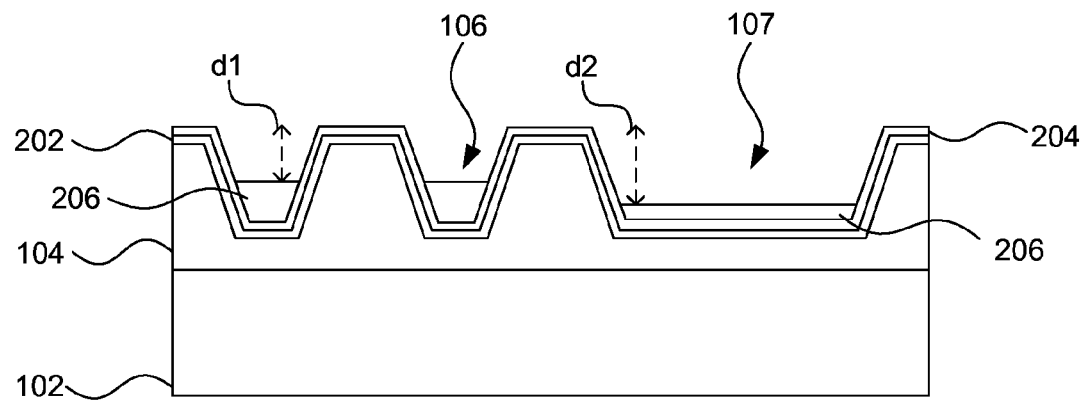
FIG. 19 is a cross-sectional view depicting reflowing the conductive filler layer in the narrow opening and the wide opening depicted in FIG. 18, in accordance with one embodiment of the present disclosure.

It should be understood that when the conductive filler layer 206 is reflowed, the conductive filler layer 206 may fill the narrow trench 106 to depth d1 which is larger than a depth d2 in the wide trench 107, as shown in FIG. 19. In FIG. 19, the conductive filler layer 206 reduces the aspect ratio of the top portion of the narrow trench 106 to a depth of d1 while the conductive filler layer 206 reduces the aspect ratio of the top portion of the wide trench 107 to a depth of d2, where the depth d1 in the narrow trench 106 is less than the depth d2 in the wide trench 107. In some embodiments, the depth d2 may reduce and/or limit wide-line resistance impact of the wide trench 107.

Figure 20:
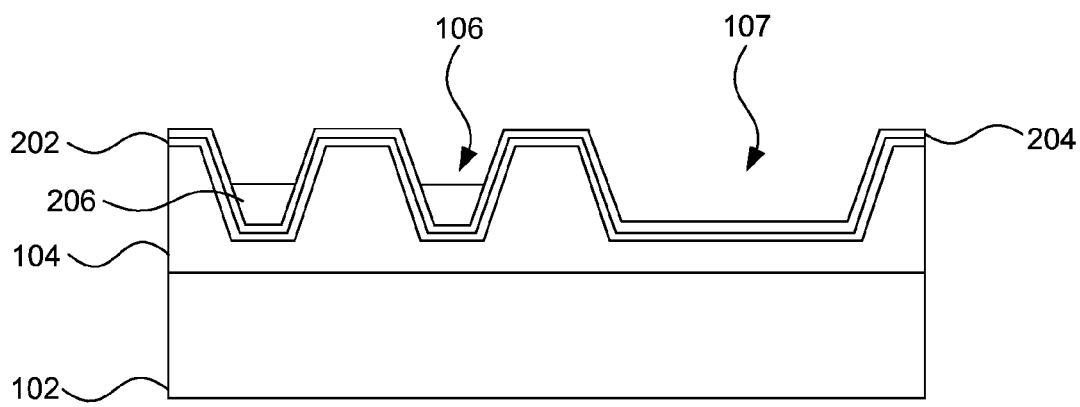
FIG. 20 is a cross-sectional view depicting removing excess portions of the conductive filler layer in the wide opening depicted in FIG. 19, in accordance with one embodiment of the present disclosure.

In an alternate embodiment, a block mask (not shown) may be formed over the wide trench 107 prior to formation of the conductive filler layer 206 to prevent the conductive filler layer 206 from being formed in the wide trench 107. For example, a mask may prevent the conductive filler layer 206 from being deposited in the wide trench 107 when bus line resistance is desired. Therefore, the hybrid metal interconnects could be isolated to only the narrowest trenches within a level, but allow larger bus lines, which do not suffer the same copper microstructure problems, to remain fully copper. In an alternate embodiment, an etching process may be employed to remove the conductive filler layer 206 from the wide trench 107, as shown in FIG. 20.

The interconnect structure that is described above with reference to FIGS. 1-20 may be employed in any electrical device. For example, the interconnect structures that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Figure 21:
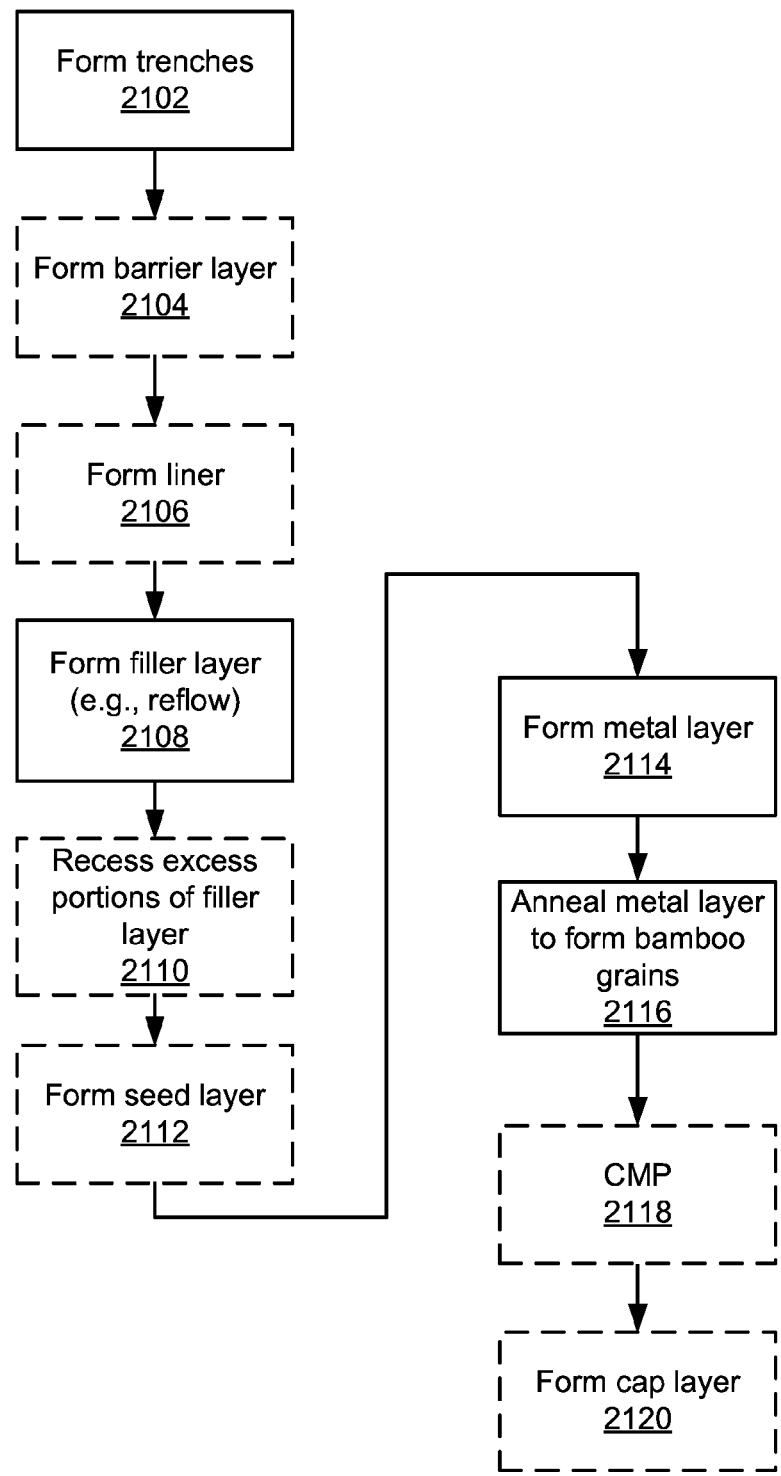
FIG. 21 is a block/flow diagram of an exemplary method for forming hybrid interconnects with a bamboo grain microstructure, in accordance with an embodiment of the present principles.

Now referring to FIG. 21, with continued reference to FIGS. 1-20, a blow/flow diagram depicting a method for forming hybrid metal interconnects with a bamboo grain microstructure is illustratively depicted in accordance with one embodiment. The method includes forming at least one trench 106 in an insulating material 104, as shown in block 2102. For example, forming trenches 106 may include patterning the insulating layer 104 by applying a photoresist to the surface to be etched, exposing the photoresist to a pattern of radiation, and developing the pattern into the photoresist utilizing resist developer. Once the patterning of the photoresist is completed, the sections of the insulating layer 104 that are covered by the photoresist are protected while the exposed regions are removed using a selective etching process that removes the unprotected regions.

In an embodiment, the method may include forming a barrier layer 202 within the trench 106, as shown in block 2104. The barrier layer 202 may be deposited using a conformal deposition process such that the barrier layer 202 includes a substantially uniform thickness. In block 2106, a liner 204 may be formed within the trench 106 over the insulating layer 104 and/or barrier layer 202. The liner 204 may be deposited using a conformal deposition process such that the liner 204 includes a substantially uniform thickness. In some embodiments, forming the liner 204 may include reflowing the liner 204 such that the liner 204 is reflowed in the bottom portion of the trench 106 (e.g., the liner 204 no longer remains on the top portions of the trench 106). The liner 204 may include any material having reflow-assist capabilities to aid in reflow of the reflowable material of the conductive filler layer 206.

In block 2108, a conductive filler layer 206 may be conformally deposited over the barrier layer 202 and/or liner 204, and the conductive filler layer 206 including a reflowable material may be reflowed (e.g., annealed) such that the conductive filler layer 206 reflows toward the bottom portion of the trench 106. Block 2108 applies an anneal process, heating the conductive filler layer 206 to reflow and fill a bottom portion of the underlying trench 106 (e.g., a partial reflow). For example, the conductive filler layer 206 may be reflowed such that the conductive filler layer 206 fills a bottom portion of the trench 106 to a predetermined depth. Because the conductive filler layer 206 is reflowed towards the bottom portion of the trench 106, only a top portion of the trench 106 remains unfilled (e.g., remaining portion), thereby resulting in a reduced aspect ratio of the top portion of the trench 106 for the metal interconnect layer 210. An optional partial recess process, such as an etchback process, selective wet etch, and/or chemical mechanical planarization (CMP), may be performed to remove any excess portions of the conductive filler layer 206, such as excess portions that remain outside of the trench 106 after the reflow anneal, as illustrated in block 2110.

In an embodiment, a seed layer 208 may be formed over the conductive filler layer 206, as shown in block 2112. The seed layer 208 may be deposited using a conformal deposition process such that the seed layer 208 includes a substantially uniform thickness. In some embodiments, the seed layer 208 may further provide a reduction in the aspect ratio of the top portion of the trench 106, which may enhance the process window of the interconnect and/or device.

In block 2114, a metal layer 210 may be formed over the seed layer 208, conductive filler layer 206, liner 204, and/or barrier layer 202. In some embodiments, the metal layer 210 may be formed by plating processes, reflow processes, deposition processes, etc. and may include small grain microstructures within the material. The metal layer 210 may be deposited such that the remaining portion of the trench 106, such as the top portion of the trench 106, is filled.

In an embodiment, the metal layer 210 may include small grain boundaries. The metal layer 210 may be annealed to form a bamboo grain microstructure 214 from the small grains where the grain boundaries of the bamboo grain microstructure form larger grains than the more numerous small grain boundaries, as shown in block 2116. A bamboo grain microstructure 214 may include grain boundaries that are substantially aligned normal to the long axis of the interconnect and/or extend completely through the thickness of one or more layers (e.g., grain boundaries perpendicular to the length of the interconnect). The reduced aspect ratio of the top portion of the trench 106 allows the small grain boundaries 212 of the metal layer 210 to largely recrystallize to bamboo grain boundaries 214, since the depth of the top portion of the trench 106 where the metal layer 210 is formed influences the grain structure. The resulting hybrid interconnect having a bamboo grain microstructure may exhibit improved electromigration performance while preventing increased line resistances.

In block 2118, a planarization process, such as chemical mechanical planarization (CMP), may be employed so that an upper surface of the metal layer 210 is coplanar with the upper surface of the insulating layer 104, in accordance with one embodiment. A cap layer, such as metal cap layer 216 and/or insulating cap layer 218 may be formed, as shown in block 2120.

Figure 22:
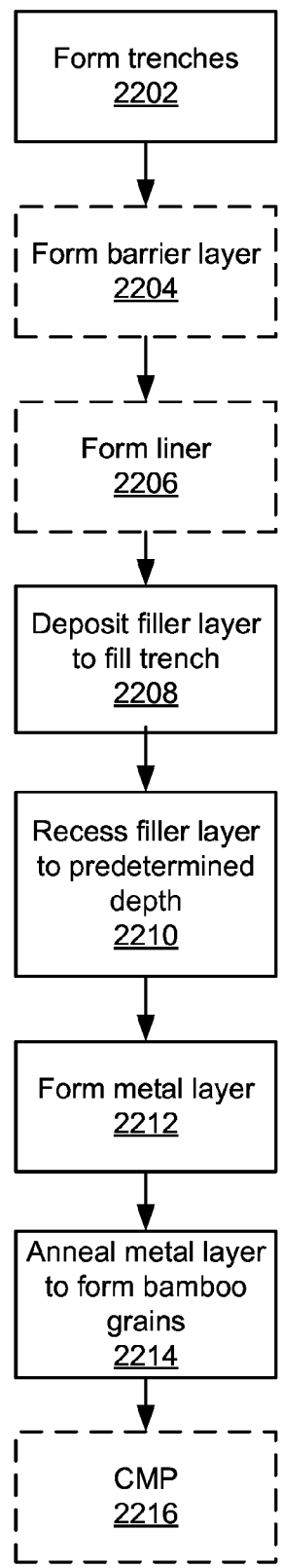
FIG. 22 is a block/flow diagram of an exemplary method for forming hybrid interconnects with a bamboo grain microstructure, in accordance with one illustrative embodiment.

Referring now to FIG. 22, with continued reference to FIGS. 1-21, a blow/flow diagram depicting an alternate method for forming hybrid metal interconnects having a bamboo grain microstructure is illustratively depicted in accordance with one embodiment. With reference to blocks 2202, 2204, and 2206, the method may include forming trenches 106, a barrier layer 202, and/or a liner 204 similar to the method as described in blocks 2102, 2104, and 2106 of FIG. 21. In block 2208, a conductive filler layer 206 may be formed such that the entire depth of the trench 106 is filled with the conductive filler layer 206 to a height above the trenches 106.

In an embodiment, the method may include recessing the conductive filler layer 206 to a predetermined depth such that a bottom portion of the trench 106 remains filled and a top portion of the trench 106 is re-exposed (e.g., unfilled) thereby reducing the aspect ratio of the top portion of the trench 106 to a threshold level (e.g., 1:1 or less), as illustrated in block 2210. In some embodiments, the recess may be accomplished by a CMP process, selective wet etch, RIE, or combination thereof to re-expose a predetermined portion of the trench 106 such that the aspect ratio of the trench 106 is reduced. For example, a CMP process may remove portions of the conductive filler layer 206 down to the liner 204 and/or barrier layer 202 and a selective wet etch may further reduce/recess the conductive filler layer 206 to a predetermined depth in the trench 106. It should be understood that recessing the conductive filler layer 206 shown in block 2210 may include a combination of recess processes. In some embodiments, such recesses processes, as described with reference to block 2210, may be performed without removing the barrier layer 202, liner 204 and/or portions of the insulating material 104, if employed.

A metal layer 210 may be formed by plating processes, reflow processes, deposition processes, etc. and may include small grain microstructures within the material, as shown in block 2212. The metal layer 210 may be deposited such that the remaining portion of the trench 106, such as the top portion of the trench 106, is filled. In block 2214, the metal layer 210 may be annealed to form hybrid metal interconnects with a bamboo grain microstructure 214. In block 2216, a planarization process, such as chemical mechanical planarization (CMP), may be employed so that an upper surface of the metal layer 210 is coplanar with the upper surface of the insulating layer 104, in accordance with one embodiment.

Having described preferred embodiments of hybrid interconnects with a bamboo grain microstructure (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming an interconnect with a bamboo grain microstructure, comprising:
    forming a conductive filler layer in a bottom portion of a trench of an insulating layer to a predetermined depth such that an aspect ratio of a top portion of the trench is reduced from an initial aspect ratio, the predetermined depth being less than a full depth of the trench;
    depositing a metal layer in the top portion of the trench over the conductive filler layer, the metal layer having a plurality of small grains; and
    annealing the metal layer to provide a bamboo grain microstructure having larger grains than grain boundaries of the plurality of small grains.

2. The method of claim 1, wherein the conductive filler layer includes a reflowable material and forming the conductive filler layer further comprises conformally depositing the reflowable material over the trench and reflowing the reflowable material into the bottom portion of the trench to the predetermined depth.

3. The method of claim 2, wherein reflowing the reflowable material includes subjecting the reflowable material to temperatures in a range approximately between 100 to 400 degrees Celsius.

4. The method of claim 1, wherein forming the conductive filler layer further comprises conformally depositing the conductive filler layer in the trench and etching the conductive filler layer down to the predetermined depth.

5. The method of claim 1, wherein the aspect ratio of the top portion of the trench is approximately 1:1 or less.

6. The method of claim 1, further comprising depositing at least one conformal layer in the trench such that the at least one conformal layer protects the insulating layer, the at least one conformal layer being disposed between the insulating layer and the conductive filler layer.

7. The method of claim 1, further comprising forming a seed layer in the trench such that the seed layer is disposed between the conductive filler layer and the metal layer.

8. The method of claim 1, further comprising forming at least one cap layer over the metal layer.

9. A method for forming an interconnect with a bamboo grain microstructure, comprising:
    depositing at least one conformal layer in a trench of an insulating layer such that the at least one conformal layer protects the insulating layer;
    forming conductive filler layer in a bottom portion of the trench to a predetermined depth such that an aspect ratio of a top portion of the trench is reduced from an initial aspect ratio, the aspect ratio being approximately 1:1 or less, wherein the predetermined depth is less than a full depth of the trench;
    depositing a metal layer in the top portion of the trench over the conductive filler layer, the metal layer having a plurality of small grains; and
    annealing the metal layer to provide a bamboo grain microstructure having larger grains than grain boundaries of the plurality small grains.

10. The method of claim 9, wherein the conductive filler layer includes a reflowable material and forming the conductive filler layer further comprises conformally depositing the reflowable material over the trench and reflowing the reflowable material into the bottom portion of the trench to the predetermined depth.

11. The method of claim 10, wherein reflowing the reflowable material includes subjecting the reflowable material to temperatures in a range approximately between 100 to 400 degrees Celsius.

12. The method of claim 9, wherein forming the conductive filler layer further comprises conformally depositing the conductive filler layer in the trench and etching the conductive filler layer down to the predetermined depth.

13. The method of claim 9, further comprising forming a seed layer in the trench such that the seed layer is disposed between the conductive filler layer and the metal layer.

14. The method of claim 9, further comprising forming at least one cap layer over the metal layer.

* * * * *